United States Patent [19]
Solomon et al.

[11] Patent Number: 6,159,287
[45] Date of Patent: Dec. 12, 2000

[54] TRUNCATED SUSCEPTOR FOR VAPOR-PHASE DEPOSITION

[75] Inventors: Glenn S. Solomon, Redwood City; David J. Miller, Belmont; Tetsuzo Ueda, Menlo Park, all of Calif.

[73] Assignees: CBL Technologies, Inc., Redwood City, Calif.; Matsushita Electronics Corporation, Osaka, Japan

[21] Appl. No.: 09/307,172

[22] Filed: May 7, 1999

[51] Int. Cl.$^7$ ................................ C30B 25/12
[52] U.S. Cl. ................ 117/101; 117/84; 117/89; 118/715; 118/728
[58] Field of Search ............... 117/84, 89, 101; 118/728, 715

[56] References Cited

U.S. PATENT DOCUMENTS

| | | | |
|---|---|---|---|
| 4,522,149 | 6/1985 | Garbis et al. | 118/728 |
| 4,807,562 | 2/1989 | Sandys | 118/728 |
| 4,926,793 | 5/1990 | Arima et al. | 118/728 |
| 5,944,904 | 8/1999 | Jackson | 118/728 |

*Primary Examiner*—Robert Kunemund
*Attorney, Agent, or Firm*—Lumen Intellectual Property Services

[57] ABSTRACT

A vapor-phase deposition system includes one or more channel units for promoting the downstream passage of reagent gases. A reactor of a vapor-phase deposition system may include one or more channels to promote passage of reagent gases beneath a susceptor stage. A susceptor, for arrangement within a reactor during epitaxial growth on a substrate, may include a truncated stage and a truncation side. The substrate may be aligned with a lower edge of the truncated stage, thereby avoiding chemical deposition on surfaces upstream of the substrate. One or more channels of the susceptor promote the downstream passage of reagent gases within the reactor. Methods for vapor-phase deposition and for promoting downstream passage of reagent gases within a reactor are also disclosed.

32 Claims, 14 Drawing Sheets

TRUNCATED SUSCEPTOR FOR VAPOR-PHASE DEPOSITION

BACKGROUND OF THE INVENTION

1. Field of the Invention

This invention relates to the field of vapor-phase deposition. This invention further relates to susceptors for crystal growth of epitaxial films on substrates. The invention also relates to a truncated susceptor for hydride vapor-phase epitaxy systems. This invention still further relates to a method for vapor-phase deposition in which premature deposition on a susceptor is avoided.

2. Backaround of the Related Art

Hydride vapor-phase epitaxy (HVPE) remains an important technique for the epitaxial growth of various semiconductors, such as gallium nitride (GaN). In HVPE systems, growth proceeds due to the high temperature, vapor-phase reaction between gallium chloride (GaCl) and ammonia ($NH_3$). The two gases are directed towards a heated substrate where they meet and react to produce solid GaN on the substrate surface. There are, however, certain difficulties associated with this growth technique. For example, the source or reagent gases can react before reaching the substrate, leading to premature deposition of GaN, i.e. GaN deposition on non-target surfaces. The substrate typically rests on a susceptor which is arranged at an angle with respect to the direction of gas flow (e.g., refer to FIG. 2). The entire susceptor, and not just the substrate, is maintained at the elevated temperatures necessary for deposition to occur. Thus, growth of solid GaN can occur on the susceptor upstream from the substrate. Such upstream GaN deposits have negative consequences for crystal growth on the substrate. Firstly, deposits of solid GaN tend to obstruct proper flow of reagent gases towards the substrate. Furthermore, if the unwanted GaN deposits accumulate beyond a certain thickness, they tend to merge with the epitaxial layer that is the object of the deposition. Merger of unwanted GaN deposits with the epitaxial layer degrades the uniformity of the GaN epitaxial layer and leads to an inferior product.

Existing methods of dealing with unwanted deposits in HVPE systems generally involve periodic removal of the susceptor, before depositions, from the reaction chamber to allow cleaning of the susceptor, either physically or by chemical etching. Such methods, however, require frequent interruption of reactor use, and are labor-intensive, time-consuming and hazardous. Furthermore, in situations where it is desired to deposit a thick layer of GaN on a substrate, unwanted deposition on the susceptor can reach problematic levels during the course of a single growth cycle. However, cleaning and maintenance of a HVPE system can only be performed after a growth cycle is complete. Techniques that attempt to remove unwanted deposits in situ, such as by passing through an etchant gas, face similar limitations: system etching also requires interruption of reactor use, and cannot be performed during a growth cycle. Also, any etchant gas that etches deposits in the susceptor will also etch the epitaxial film.

The present invention resolves problems associated with the premature or non-target growth of crystals in prior art vapor-phase chemical deposition systems and methods. The present invention minimizes labor-intensive, time-consuming, and expensive maintenance of a HVPE system by preventing premature upstream deposition on the susceptor surface. In particular, the invention eliminates problems associated with unwanted deposition on susceptor surfaces upstream from the substrate during hydride vapor-phase epitaxy.

SUMMARY OF THE INVENTION

In view of the above, it is an object of the present invention to provide a method of avoiding unwanted vapor-phase deposition.

One feature of the invention is that it provides a vapor-phase deposition system including at least one channel unit.

Another feature of the invention is that it provides a susceptor having a truncation side.

Another feature of the invention is that it provides a susceptor having at least one channel.

Another feature of the invention is that it provides a vapor-phase deposition system including a reactor having at least one channel unit.

Another feature of the invention is that it provides a method for promoting the passage of reagent gases from beneath a substrate of a HVPE system.

One advantage of the invention is that it provides a method of avoiding unwanted vapor-phase deposition on susceptors in HVPE systems.

Another advantage of the invention is that it provides a susceptor in which a stage of the susceptor is truncated upstream from a substrate.

Another advantage of the invention is that it provides a susceptor having at least one channel.

Another advantage of the invention is that it provides a deposition system having at least one channel unit for downstream passage of reagent gases.

These and other objects, advantages and features are accomplished by the provision of a vapor-phase deposition system including: a reactor having a reactor wall; a susceptor including a stage; and at least one channel unit for promoting downstream passage of gases beneath the stage.

These and other objects, advantages and features are accomplished by the provision of a susceptor for performing vapor-phase epitaxy, including a basal side, a stage, a truncation side and a nose portion, the nose portion terminating in a nose end-piece, the stage having a stage lower edge, and the truncation side having a truncation side upper edge, the stage and the truncation side joined at the stage lower edge and the truncation side upper edge to define the nose end-piece, the truncation side angled with respect to the basal side such that the nose end-piece is elevated with respect to the basal side.

These and other objects, advantages and features are accomplished by the provision of a method of vapor-phase deposition of a material on a substrate, including the steps of: a) providing a substrate; b) positioning the substrate on a stage of a susceptor, the susceptor including a basal side, a stage, and a nose portion, the nose portion terminating in a nose end-piece; c) providing a reactor system having at least one channel unit, the at least one channel unit for promoting downstream passage of gases beneath the nose end-piece; d) arranging the susceptor within the reactor; and e) introducing a stream of reagent gases into the reactor.

These and other objects, advantages and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

DETAILED DESCRIPTION OF THE PREFERRED EMBODIMENTS

Figure 1:
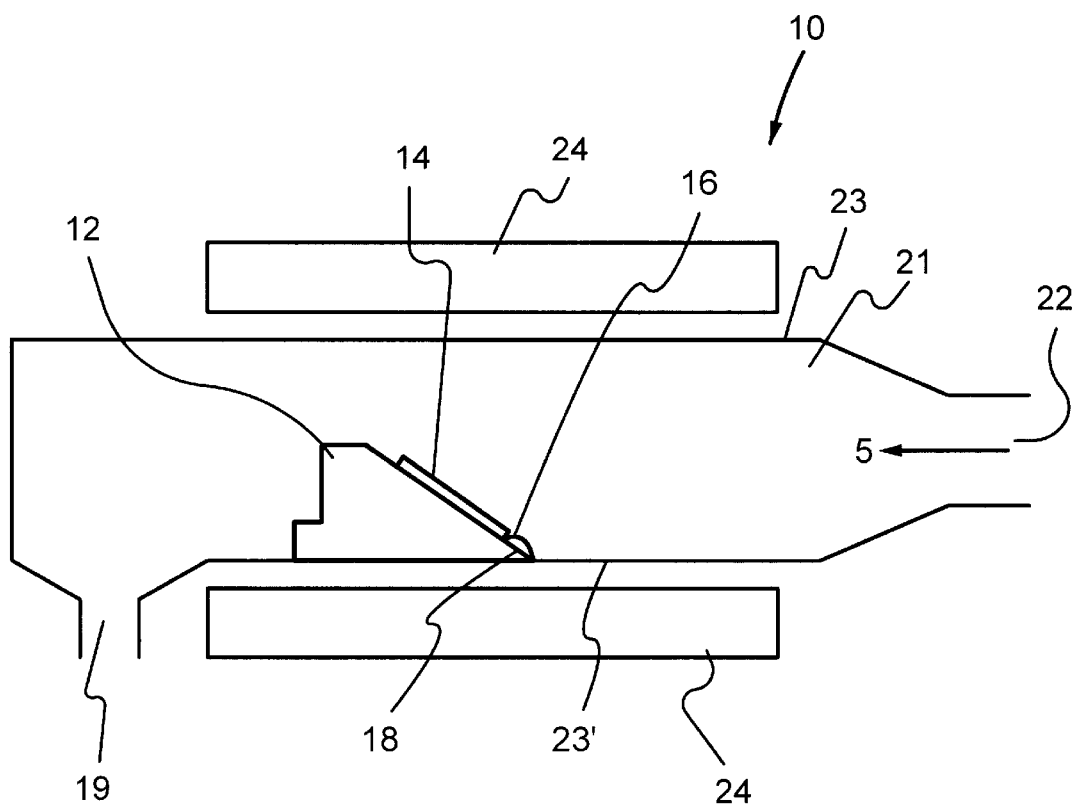
FIG. 1 schematically represents a HVPE system including a prior art susceptor, according to the prior art.
Figure 2:
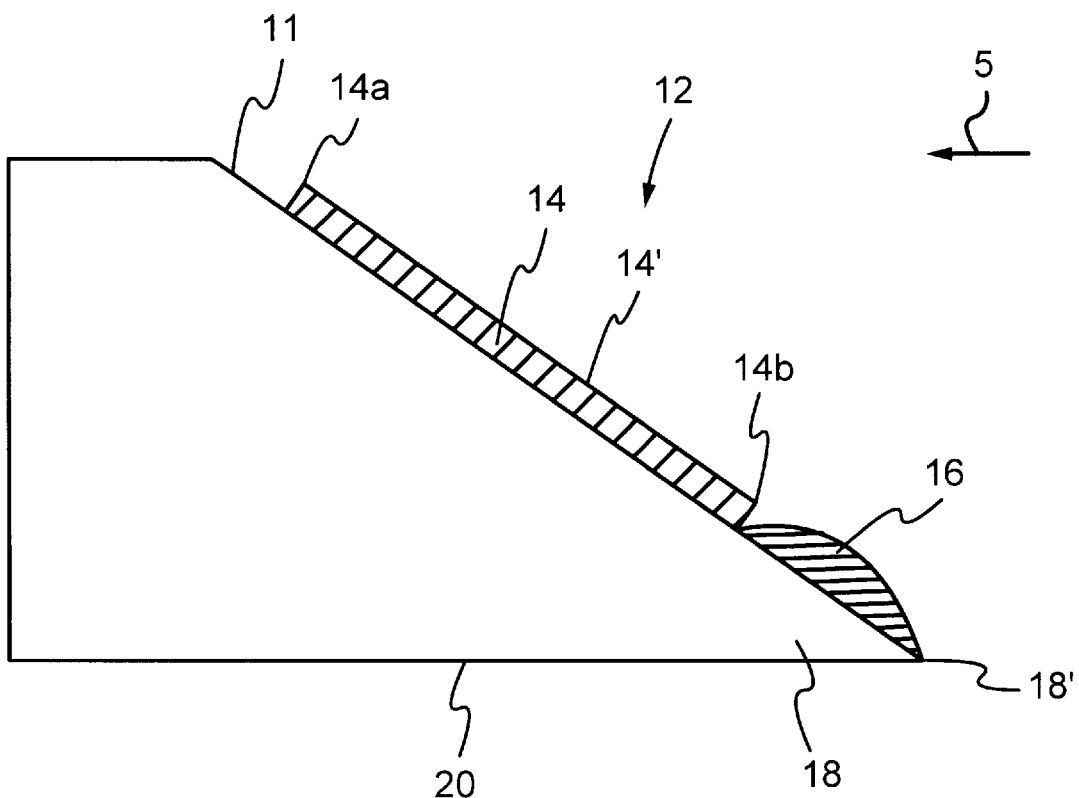
FIG. 2 is a side view of a prior art susceptor, also according to the prior art.

Referring now to the drawings, FIG. 1 schematically represents a typical prior art HVPE system 10 including a susceptor 12 of the prior art. System 10 is entirely contained within a furnace 24. Inside furnace 24 is a growth tube or reactor 21, typically made of quartz. Growth tube 21 contains a heated substrate 14 which is disposed on susceptor 12. Epitaxial deposition proceeds by the vapor-phase reaction of source or reagent gases which are introduced into reactor 21 through an inlet 22. Substrate 14 is disposed on a stage 11 (FIG. 2). Stage 11 is disposed at an angle with respect to the direction of reagent gas flow (represented by the arrow) 5. This angled arrangement of stage 11 increases the contact area of gas stream 5 with surface 14' of substrate 14.

FIG. 2 shows, in side view, prior art susceptor 12 in greater detail. Prior art susceptor 12 includes a region 18 upstream of substrate 14 on which source gases impinge before reaching substrate 14. The elevated temperature of susceptor 12 allows source gases 5 to react on any surface of susceptor 12. In particular, deposition of a solid material 16 at location 18, upstream from substrate 14, is particularly problematic. At nose location 18, the concentration of reagents in the incident gas stream 5 is maximal. Deposits 16 interfere with the free flow of reagent gases 5, and in addition, deposits 16 can merge with the epitaxial layer on substrate 14, leading to degradation of surface morphology of the epitaxial layer. Further particles from the upstream deposition may be transferred by convection to the substrate 14 during deposition and lead to poor surface morphology. Susceptor 12 further includes a basal side 20 while nose region 18 terminates in nose end-piece 18'. Since the entire susceptor 12 is maintained at an elevated temperature (in the range of 800 to 1100° C.) deposition can occur at any location on the surface of susceptor 11.

Figure 3A:
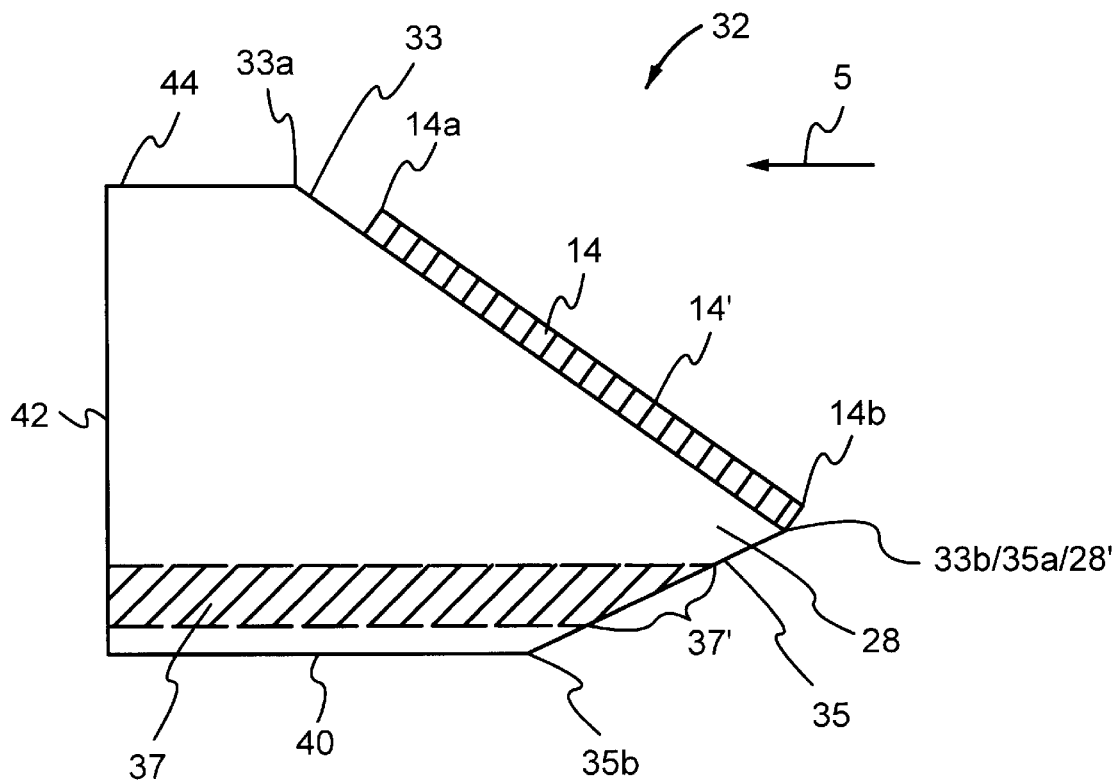
FIG. 3A shows a side view of a truncated susceptor, according to one embodiment of the invention.

FIG. 3A shows, in side view, a susceptor 32 according to one embodiment of the instant invention. Susceptor 32 includes a basal side 40, a rear side 42, an upper side 44, a stage 33, a truncation side 35, and a nose portion 28 terminating in nose end-piece 28'. At least one channel 37 may be included at a location beneath nose end-piece 28'. Stage 33 includes stage upper edge 33a and stage lower edge 33b, while truncation side 35 includes truncation side upper edge 35a and truncation side lower edge 35b. Truncation side 35 and stage 33 join at nose end-piece 28'. Truncation side upper edge 35a and stage lower edge 33b coincide with nose end-piece 28'. In use, substrate 14 is arranged on stage 33 such that substrate lower edge 14b is at least substantially aligned with nose end-piece 28'.

In comparison with prior art susceptor 12, (e.g., FIG. 2), stage 33 of susceptor 32 of the invention is truncated to eliminate surfaces upstream from substrate lower edge 14b. At the same time, according to the invention, one or more channel units are provided to promote the passage of reagent gases beneath nose end-piece piece 28'. Susceptor 32 of the invention may be used in conjunction with a prior art reactor, generally as described above with reference to FIG. 1. Truncation of susceptor 32 according to the invention does not prevent substrate 14 from being positioned in the center of reactor 21. The provision of truncated susceptor 32, according to certain embodiments of the instant invention, eliminates a major site at which unwanted deposition occurs in prior art HVPE systems.

Figure 3B:
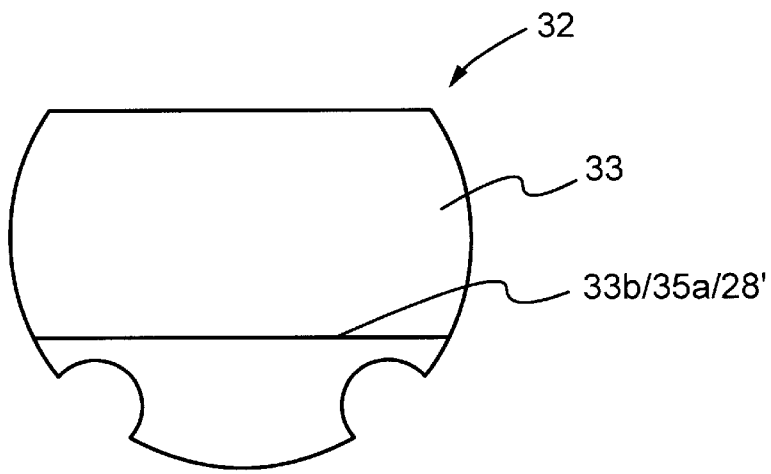
FIG. 3B is an end view of a truncated susceptor, according to the invention.

FIG. 3B shows an end view of truncated susceptor 32 as seen from an upstream location, i.e., from the direction of flow of gas stream 5, according to one embodiment of the invention. Stage 33 and truncation side 35 join at nose end-piece 28'. Channels 37 are located on the underside of susceptor 32, originating at channel port 37' within truncation side 35 below nose end-piece 28'. In FIG. 3B, two channels 37 are shown in a symmetrical arrangement. However, other numbers and/or arrangements for channel(s) 37 are contemplated and are within the scope of the invention. Reagent gases that do not impinge on substrate 14 are carried efficiently through channels 37 and out of reactor 21, thereby avoiding unwanted deposition of reaction product (s). Further, the susceptor configuration described above avoids eddy-flows of reagents in the front of the susceptor. Eddy-flows are undesirable because they cause uneven flow of reagents to the substrate leading to uneven depositions and un-wanted deposition on the walls of the reactor.

Figure 3C:
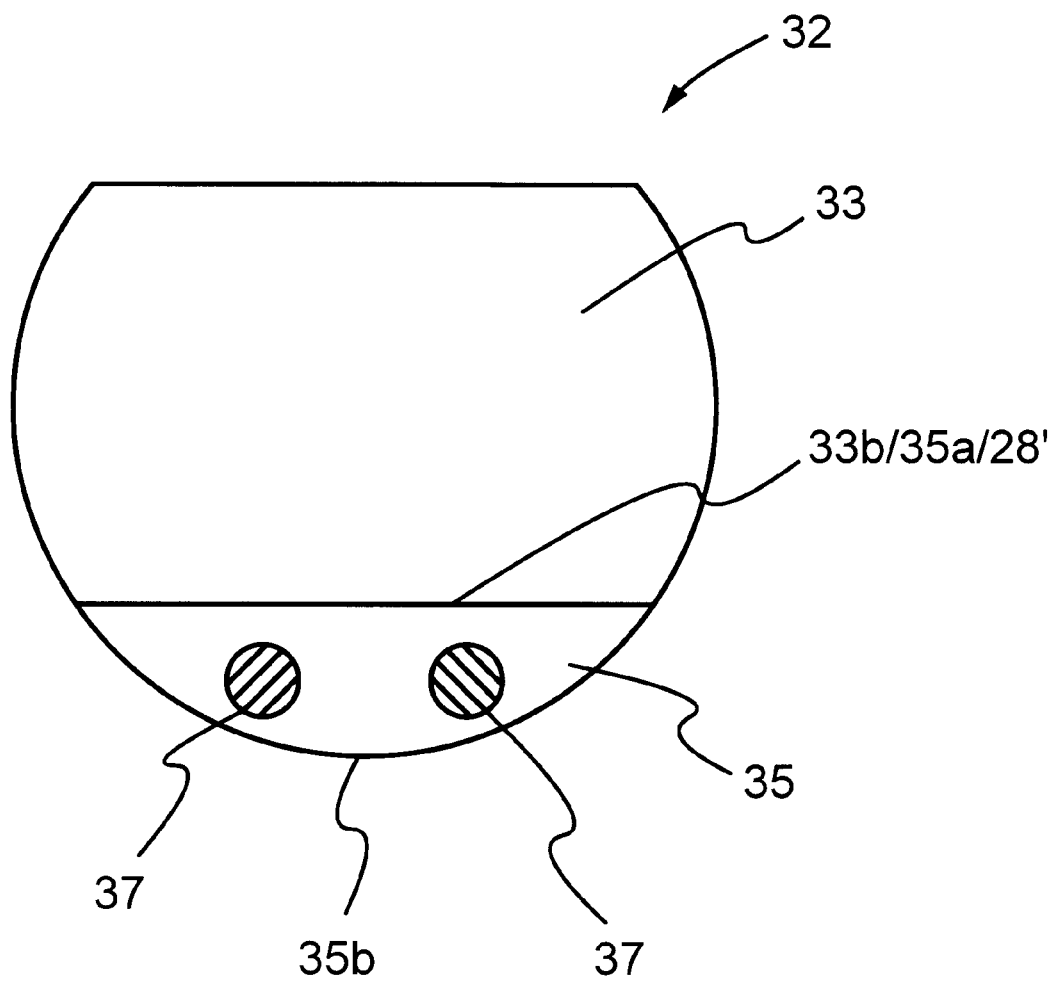
FIG. 3C is an end view of a truncated susceptor, according to another embodiment of the invention.

FIG. 3C also shows an end view of a truncated susceptor 32 as seen from an upstream location, i.e., from the direction of gas stream 5, according to another embodiment of the invention. The embodiment of FIG. 3C is substantially analogous to that depicted in FIG. 3B. Thus, two channels 37 are located on the underside of susceptor 32 originating within truncation side 35 below nose end-piece 28' in a symmetrical arrangement. However, in the embodiment of FIG. 3C channels 37 are entirely enclosed in the form of ducts within susceptor 32. Although two channels 37 are shown in FIG. 3C, other numbers and/or arrangements for channel(s) 37 are contemplated and are within the scope of the invention. As for the embodiment of FIG. 3B, reagent gases that do not impinge on substrate 14 are carried efficiently through channels 37 of the embodiment of FIG. 3C and out of reactor 21. According to the invention, each channel 37 comprises a channel unit.

Figure 4A:
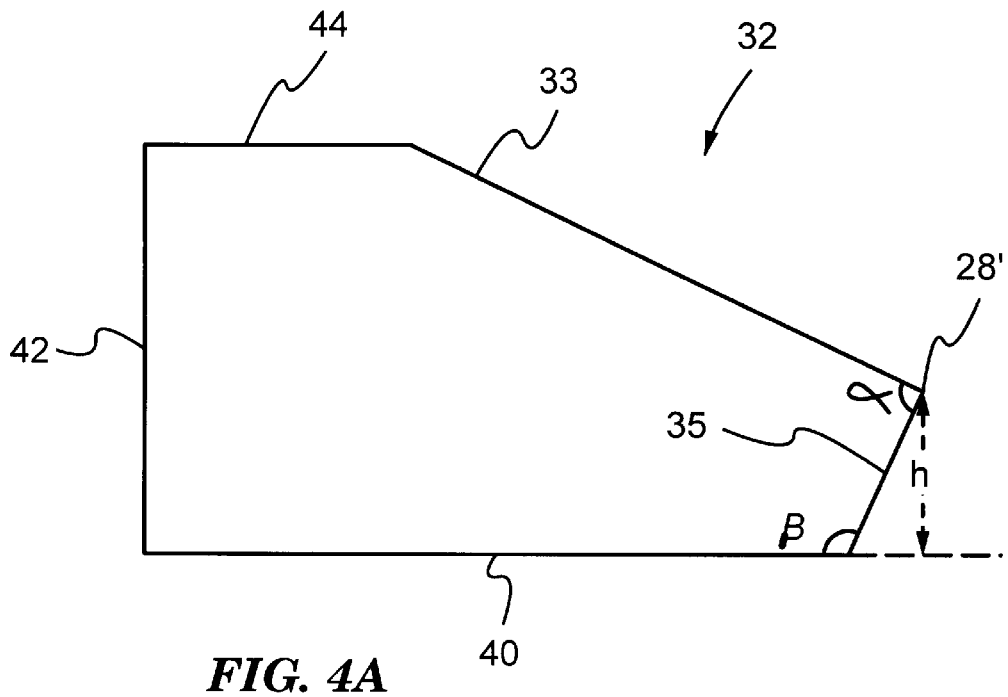
FIGS. 4A–C illustrate in side view different geometries of truncated susceptors, according to various embodiments of the invention.
Figure 4B:
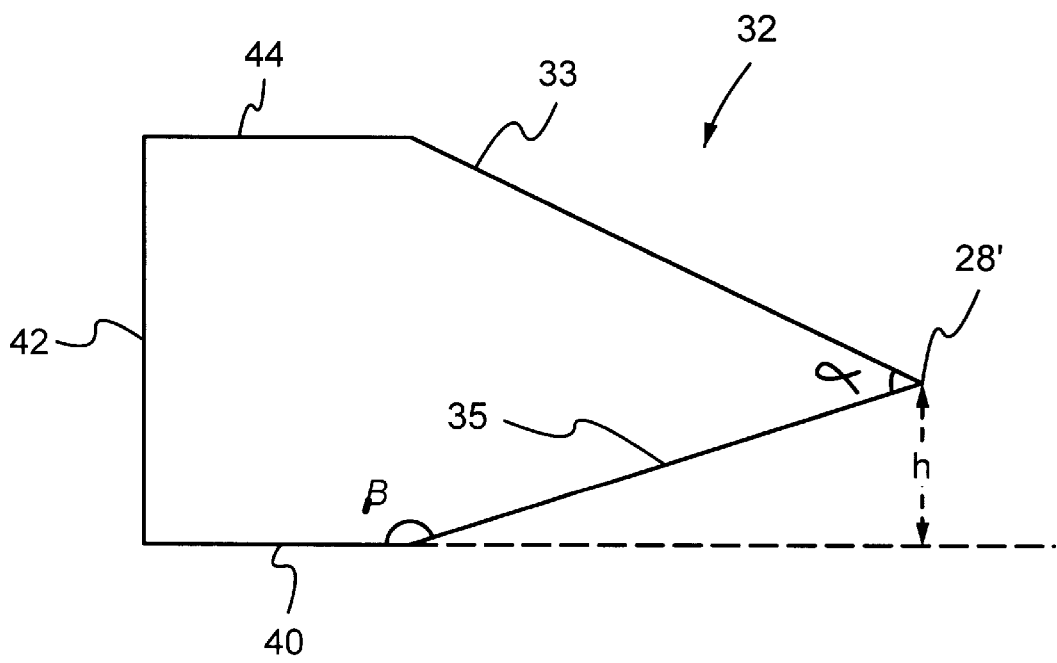

FIGS. 4A and 4B each show a side view of susceptor 32 having different geometries, according to the invention. Stage 33 is angled downwards from upper side 44 to join truncation side 35 at nose end-piece 28'. Truncation side 35 is angled upwards from basal side 40. Stage 33 and truncation side 35 form interior angle a. Basal side 40 and truncation side 35 form interior angle β. Nose end-piece 28' is elevated above the plane of basal side 40 to height, h. In the embodiment of FIG. 4B it can be seen that angle β is larger than the corresponding angle of FIG. 4A, while angle a is smaller than the corresponding angle of FIG. 4A, and height h is decreased as compared with FIG. 4A.

The particular value of a, β, and h naturally depend on the geometry of susceptor 32. Angle a is preferably in the range of from 10 to 90°; more preferably from 15 to 45°; and most preferably from 20 to 30°. Angle β is preferably in the range of from 90 to 180°; more preferably from 120 to 170°; and most preferably from 150° to 170°. Height to inside diameter ratio, h/ID is preferably in the range of from 0.1 to 0.6; more preferably from 0.25 to 0.5; and most preferably in the range of from 0.3 to 0.4.

Figure 4C:
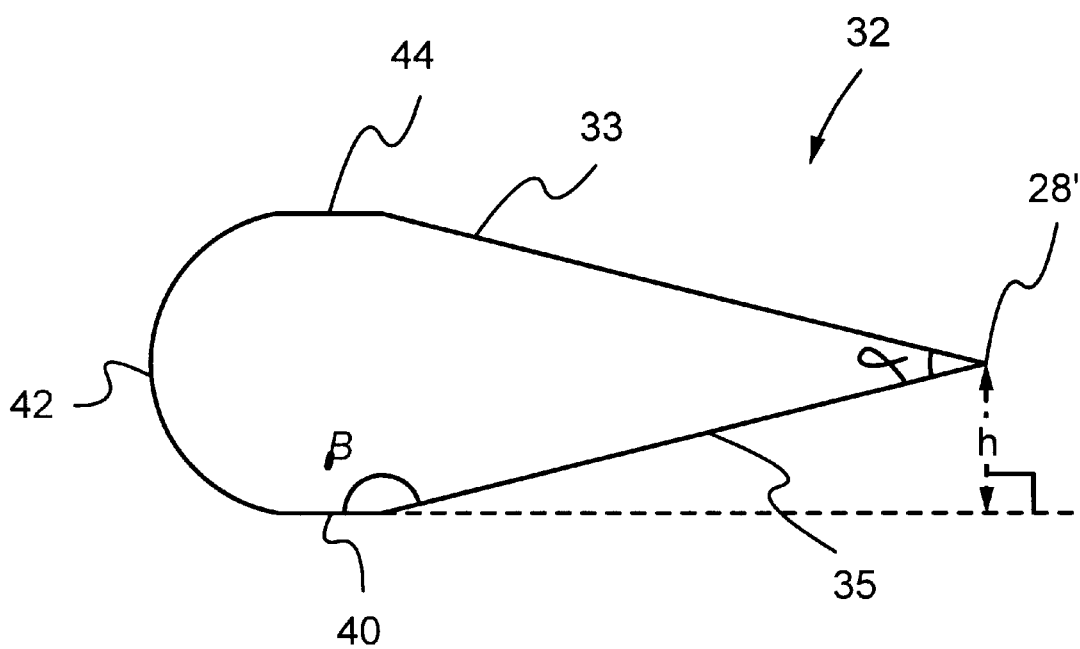

FIG. 4C illustrates, in side view, a truncated susceptor 32, according to another embodiment of the invention. The embodiment of FIG. 4C is generally similar to those depicted in FIGS. 4A–B. However, the embodiment of FIG. 4C includes a more curvaceous rear side 42. Curved geometries for susceptor 32 may promote smoother passage of reagent gases through reactor 21 and more uniform epitaxial growth on substrate 14. In one sense, the curved rear side 42 of the embodiment of FIG. 4C represents another form of truncation of susceptor 32. Alternatively, susceptor 32 may be truncated angularity between rear side 42 and basal side 40, to form truncation side rear side. Channel(s) 37 are omitted from FIGS. 4A–C for the sake of clarity.

Figure 5A:
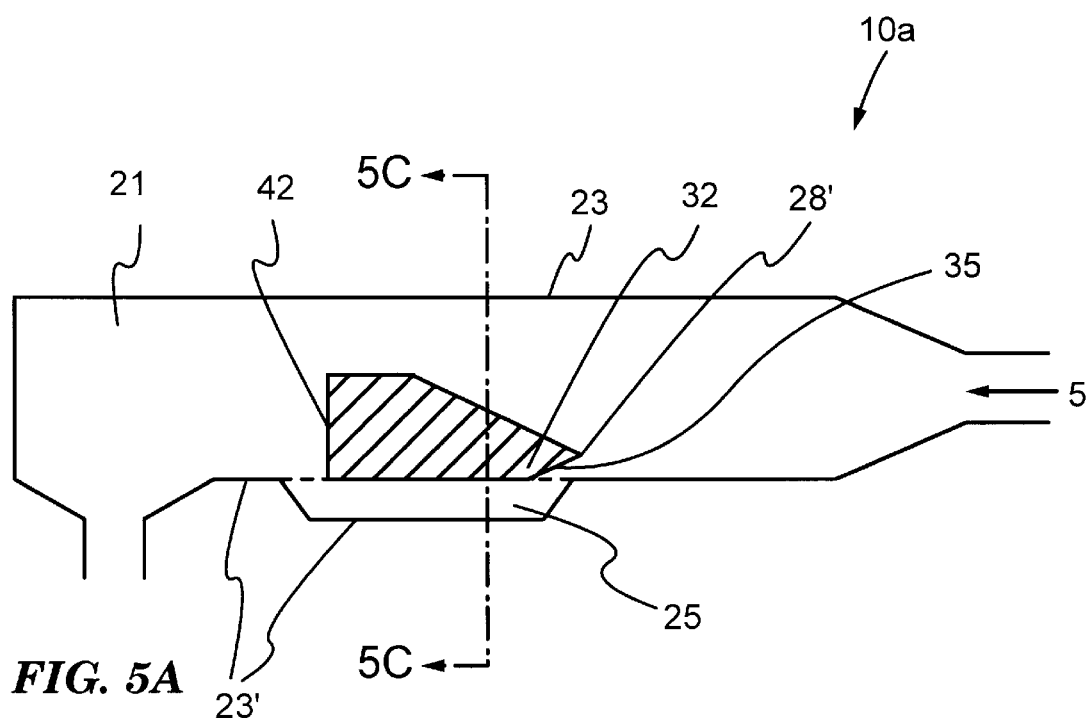
FIG. 5A is a side view of a chemical vapor deposition system, according to another embodiment of the invention.

FIG. 5A is a side view of a chemical vapor deposition system 10a, according to another embodiment of the invention. Deposition system 10a includes susceptor 32 and reactor 21 having reactor wall 23. Reactor wall 23 includes reactor wall lower portion 23'. Susceptor 32 includes stage 33 and may include truncation side 35. Reactor 21 includes at least one reactor channel 25. Reactor channel 25 may take the form of, for example, a groove within reactor wall 23. According to a currently preferred embodiment, reactor channel 25 may be located in reactor wall lower portion 23'. The length of reactor channel 25 may vary, e.g., depending on the particular application(s) of epitaxy system 10a. However, it is generally preferred for reactor channel 25 to extend, at the least, from nose end-piece 28' to beyond (i.e. downstream of) rear side 42. According to the invention, each reactor channel 25 comprises a channel unit.

Figure 5B:
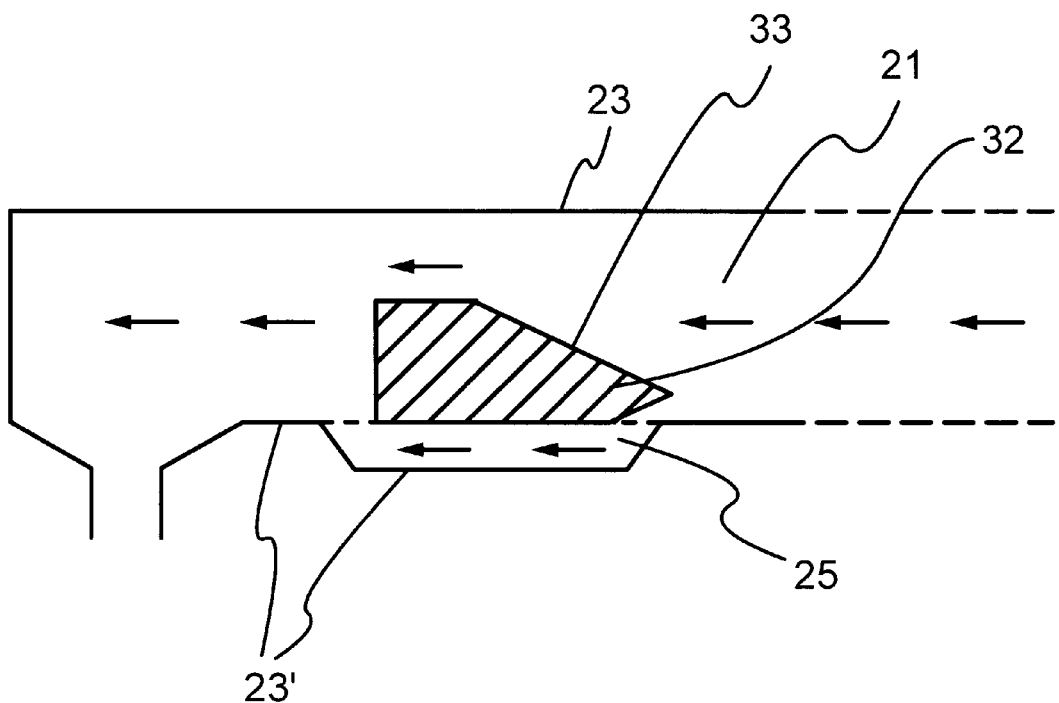
FIG. 5B shows a region of the chemical vapor deposition system of FIG. 5A in greater detail, according to the invention.

FIG. 5B shows a portion of chemical vapor deposition system 10a of FIG. 5A in greater detail. Downstream flow of gases within reactor channel 25, as well as within the main portion of reactor 21, is schematically represented by the arrows. It can be seen that reactor channel 25 allows the downstream passage of reagent gases beneath stage 33. Furthermore, the embodiment of FIG. 5A may also be used with prior art (i.e. non-truncated) susceptors 12, while allowing passage of reagent gases beneath stage 11 thereby preventing unwanted deposition upstream of substrate 14. However, currently preferred embodiments of the invention contemplate the use of truncated susceptor 32 in conjunction with the embodiment of reactor 21 depicted in FIG. 5A.

Figure 5C:
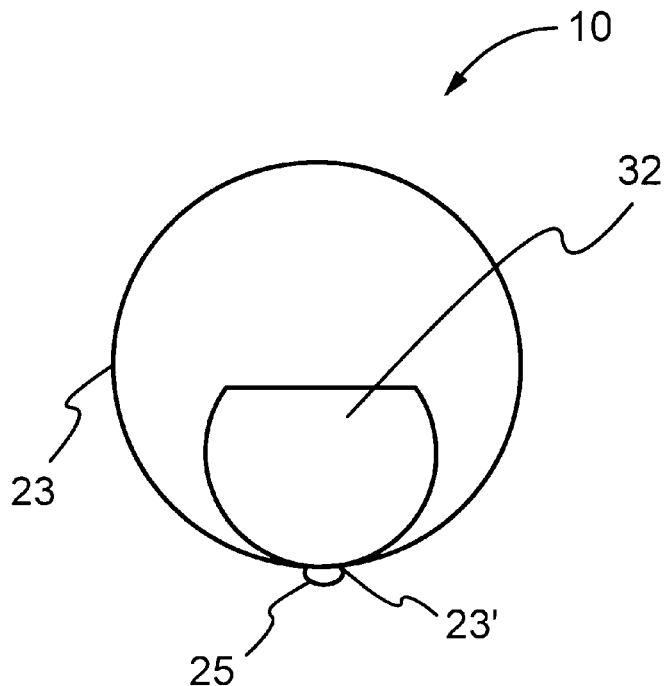
FIG. 5C shows a cross-section of the chemical vapor deposition system of FIG. 5A taken along the line 5C—5C, according to the invention.

FIG. 5C shows deposition system 10a of FIG. 5A in cross-section as viewed along the line 5C—5C, according to one embodiment of the invention. Only a single reactor channel 25 is shown in FIG. 5C, however according to the invention, a plurality of reactor channels 25 may be included within reactor 21. Furthermore, reactor channel 25 is shown in FIG. 5C as being located within reactor wall lower portion 23', although other locations and arrangements for reactor channel 25 are possible under the invention.

Figure 6A:
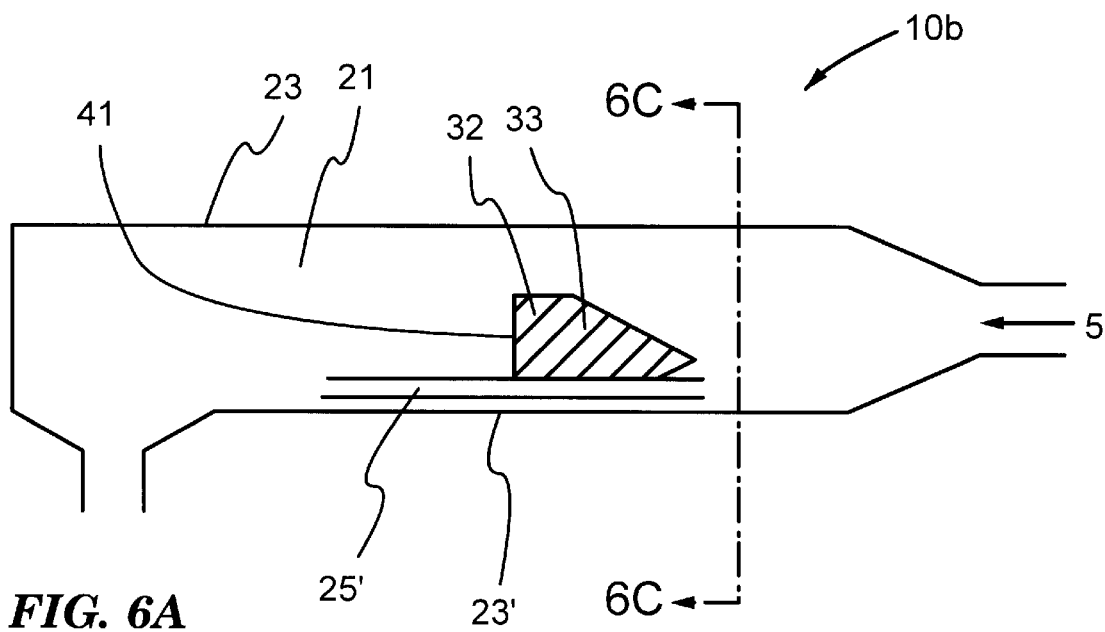
FIG. 6A schematically represents a chemical vapor deposition system as seen from the side, according to another embodiment of the invention.

FIG. 6A schematically represents a deposition system 10b, as seen from the side, according to another embodiment of the invention. System 10b of FIG. 6A is generally similar to system 10a of FIG. 5A, having susceptor 32 and reactor 21. System 10b further includes at least one conduit 25'. The at least one conduit 25' may be a separate component positioned against reactor wall 23, or according to an alternative embodiment, the at least one conduit 25' may be integral with reactor wall 23. In any event, susceptor 32 is disposed in relation to the at least one conduit 25' such that reagent gases pass downstream through the at least one conduit 25' and beneath stage 33. In this way, the at least one conduit 25' promotes the downstream passage of gases within reactor 21. According to one embodiment of the invention, at least one conduit 25' may be in the general form of a hollow tube. Such tube(s) may be round, square, oblong, etc., in cross-section. Preferably, the walls of such tube(s) have a certain amount of rigidity, or can otherwise support susceptor 32 without undue deformation of the tube(s). According to the invention, each conduit 25' comprises a channel unit.

Figure 6B:
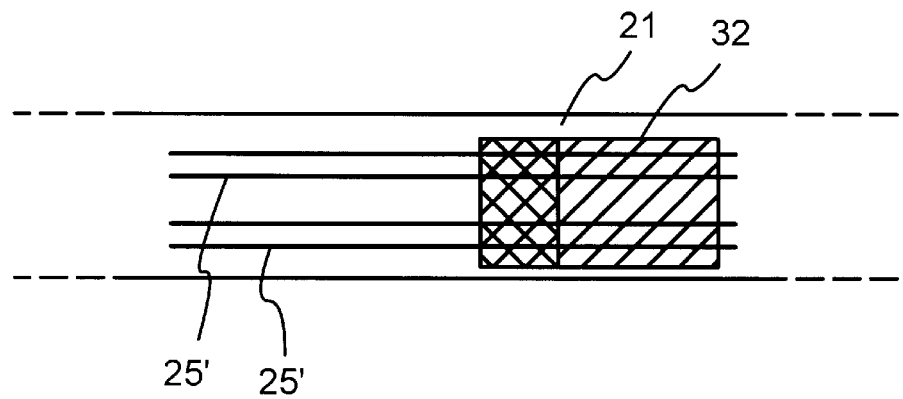
FIG. 6B shows a plan view of the chemical vapor deposition system of FIG. 6A, according to the invention.

FIG. 6B shows a plan view of system 10b of FIG. 6A, depicting a pair of channels or conduits 25' in a parallel arrangement, with susceptor 32 disposed on conduits 25'. The length and width (or diameter) of conduits 25' is, to a certain extent, a matter of design choice. That is to say, the dimensions of conduit(s) 25' may be varied according to other components, e.g. susceptor 32 and reactor 21, of system 10b, and according to other factors including the intended or actual application(s) of system 10b. Preferably, conduit(s) 25' extend at least from nose end-piece 18'/28' (FIGS. 2, 3A) to rear side 42 of susceptor 32.

Figure 6C:
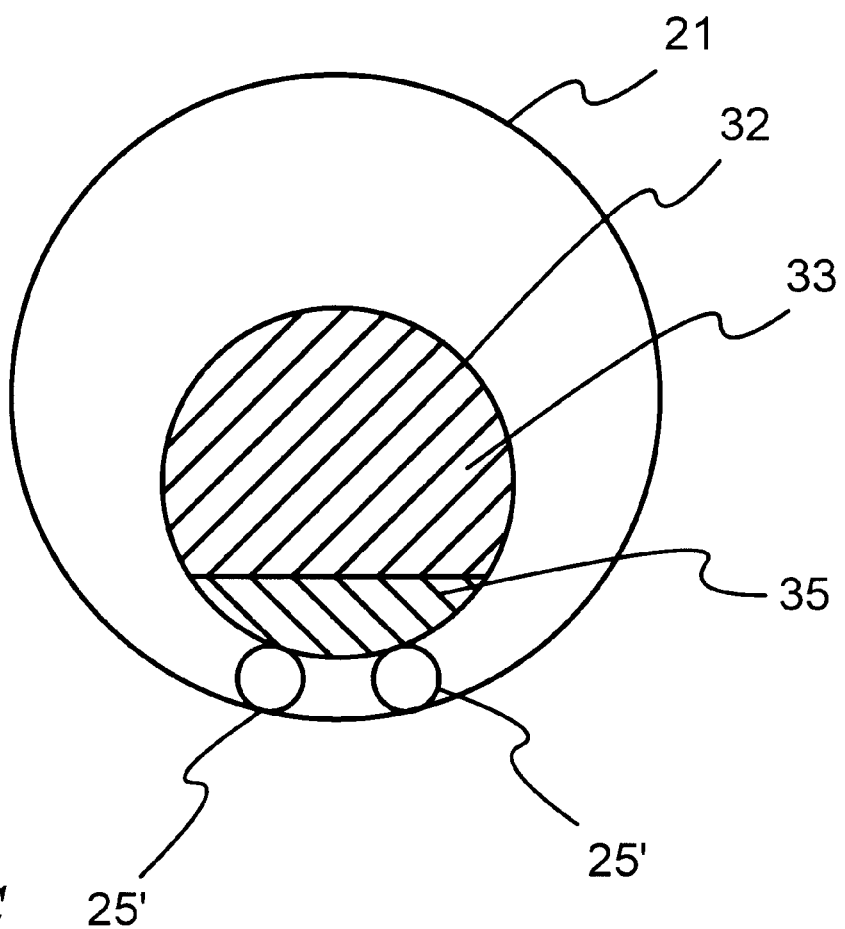
FIG. 6C shows a cross-section of the chemical vapor deposition system of FIG. 6A taken along the line 6C—6C, according to the invention.

FIG. 6C shows a cross-section of the chemical vapor deposition system 10b of FIG. 6A taken along the line 6C—6C, according to the invention. In this embodiment, susceptor 32 is disposed on a pair of conduits 25', wherein the latter have a generally circular cross-section. It should be noted that other cross-sectional shapes for conduit(s) 25' are within the scope of the invention. For example, the susceptor 32 is disposed on a pair or rails, wherein reagent gas can flow between the rails.

As disclosed hereinabove with reference to system 10a of FIGS. 5A–C, system 10b also effectively promotes the downstream passage of reagent gases, via conduit(s) 25', beneath stage 33, thereby preventing unwanted upstream deposition during vapor-phase epitaxy. This applies generally both to prior art susceptor 12 and to truncated susceptor 32 of the instant invention. However, truncated susceptor 32 further promotes downstream passage of reagent gases beneath stage 33 in system 10b. Therefore, it is currently preferred to employ susceptor 32 in conjunction with system 10b.

Figure 7A:
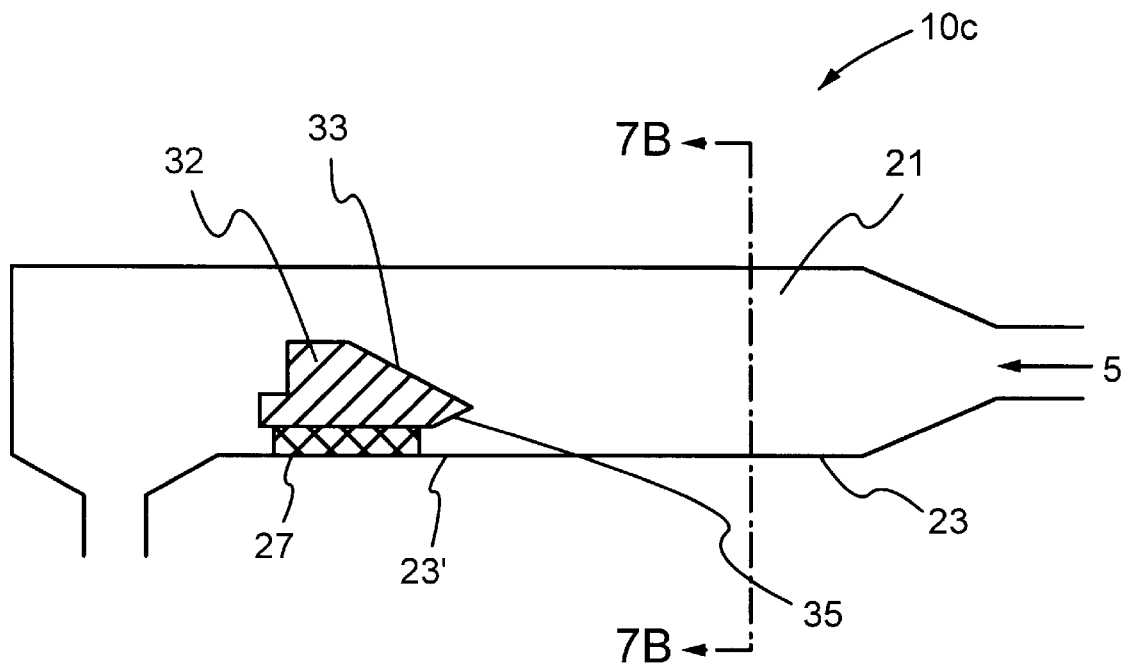
FIG. 7A is a side view of a chemical vapor deposition system, according to another embodiment of the invention.

FIG. 7A is a side view of a chemical deposition system 10c, according to another embodiment of the invention. System 10c is somewhat analogous to system 10b (described hereinabove), having susceptor 32 (truncated) or 12 (untruncated) housed within wall 23 of reactor 21. However, system 10c includes at least one susceptor support unit 27 arranged within reactor 21. Susceptor 32/12 (e.g., FIGS. 2, 3A) is arranged on at least one susceptor support unit 27 or rails. Unit 27 promotes the downstream passage of reagent gases beneath stage 33/11. According to the invention, susceptor support unit 27 comprises a channel unit.

Figure 7B:
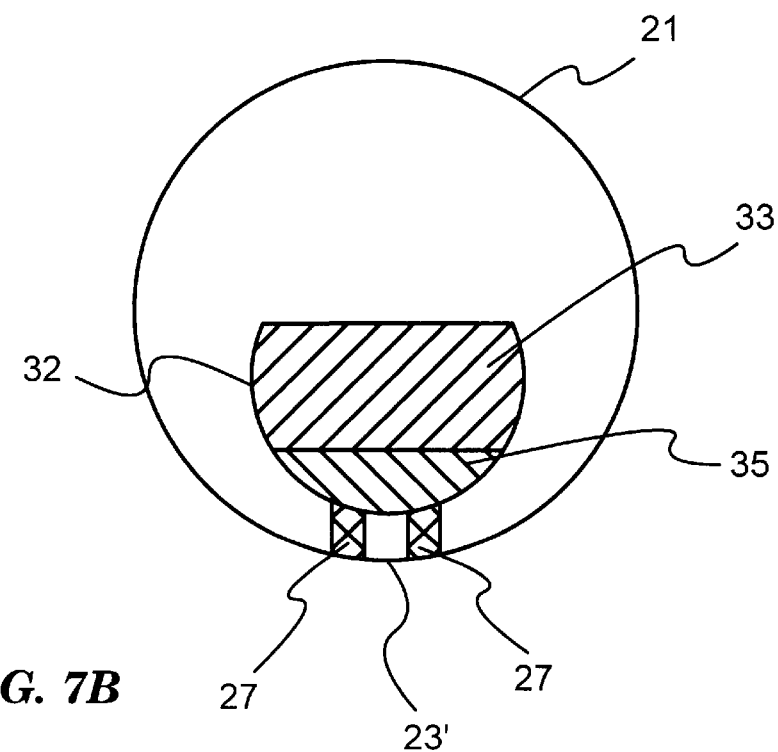
FIG. 7B shows a cross-section of the chemical vapor deposition system of FIG. 7A taken along the line 7B—7B, according to the invention.

FIG. 7B shows a cross-section of deposition system 10c taken along the line 7B—7B of FIG. 7A. In this embodiment, the at least one susceptor support unit 27 comprises a pair of units 27 disposed on reactor wall lower portion 23 of reactor 21. Units 27 depicted in FIG. 7B are substantially rectangular in cross section. However, other numbers, shapes and arrangements for units 27 are contemplated and are within the scope of the invention.

FIGS. 7A–B depict a preferred embodiment of the invention in which susceptor 32, having truncation side 35, is the susceptor of choice. However, due to the effective downstream channeling of reagent gases between unit(s) 27, prior art susceptor 12 may also be employed in system 10c.

Figure 8A:
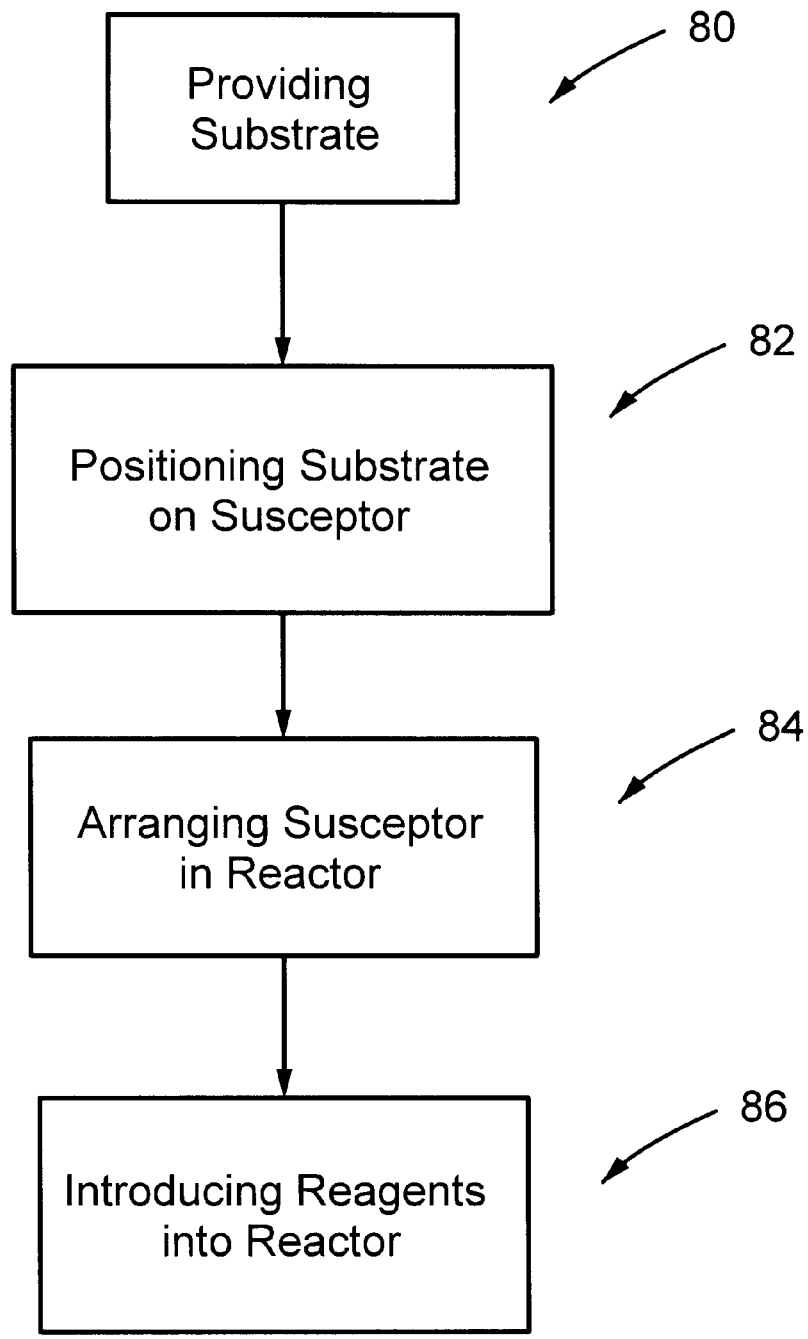
FIG. 8A schematically represents a series of steps involved in a method for vapor-phase deposition, according to another embodiment of the invention.

FIG. 8A schematically represents a series of steps involved in a method for vapor-phase deposition, according to another embodiment of the invention, in which step 80 involves providing a substrate on which deposition is to be performed. Numerous suitable substrates (including sapphire, silicon-carbide, silicon, gallium arsinide, zinc oxide and magnesium oxide) for use in HVPE, are well known in the art. Step 82 involves positioning the substrate on the stage of the susceptor. The susceptor on which the substrate is positioned includes a truncation side, and may further include additional features described hereinabove with reference to susceptor 32 of FIG. 3A. Preferably, the substrate is disposed on the stage such that the lower edge of the substrate is substantially aligned with the lower edge of the stage.

Step 84 involves arranging the susceptor within the reactor. The precise arrangement of the susceptor within the reactor may depend on a number of factors, including the application and the nature of the reactor. For example, the susceptor may be placed on one or more conduits or susceptor support units disposed within the reactor. Alternatively, according to another embodiment of the invention, the susceptor may be placed over one or more reactor channel or grooves located within the wall of the reactor. Step 86 involves introducing a stream of reagent gases into the reactor via the reactor inlet. Reagent gases may include, for example, a basic gas such as ammonia, and a chloride of a group III element such as Ga, In, or Al, and organo-metallic compounds of Ga, In or Al.

Figure 8B:
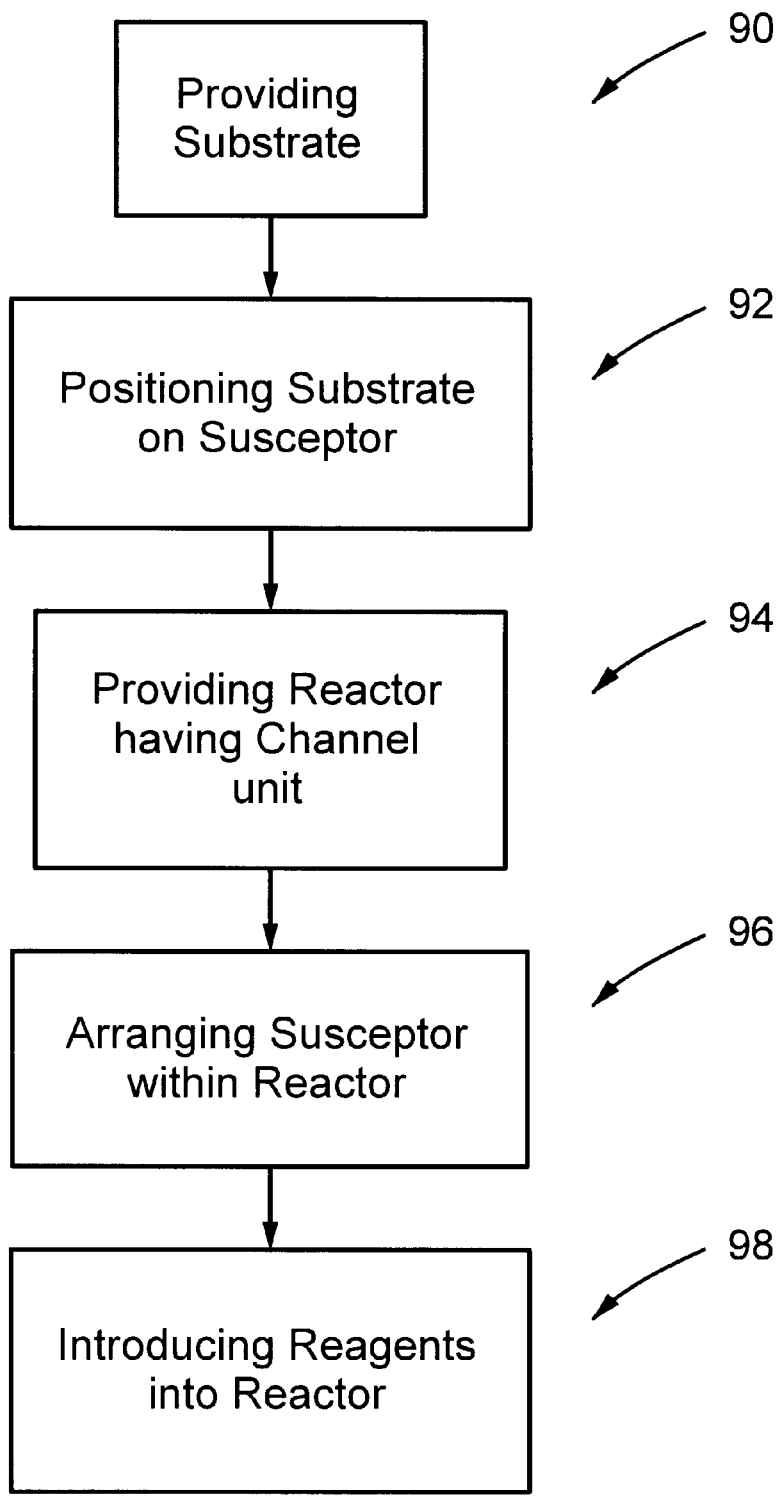
FIG. 8B schematically represents a series of steps involved in a method for vapor-phase deposition, according to another embodiment of the invention.

FIG. 8B schematically represents a series of steps involved in a method for vapor-phase deposition, according to another embodiment of the invention, in which steps 90 and 92 are analogous to step 80 and 82, respectively (described hereinabove with reference to FIG. 8A). Step 94 involves providing a reactor having at least one channel unit. The at least one channel unit of the reactor provided in step 94 may comprise, for example, one or more reactor channels, susceptor support units, or conduits. Steps 96 and 98 are analogous to steps 84 and 86, respectively, and described hereinabove.

Figure 8C:
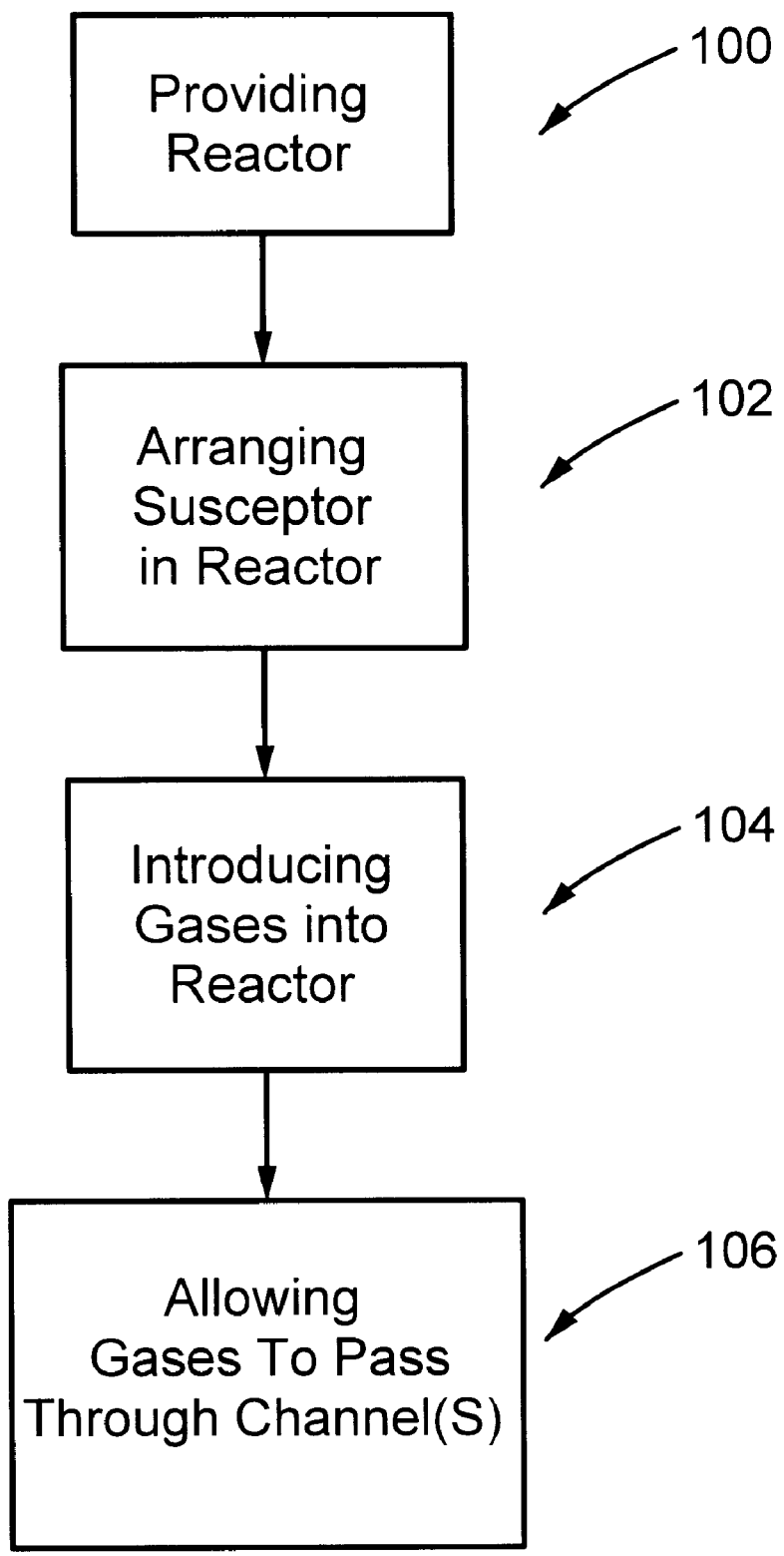
FIG. 8C schematically represents a series of steps involved in a method for removing reagent gases from a reactor of a vapor-phase epitaxy system, according to another embodiment of the invention.

In another aspect of the invention described fully hereinbelow (FIG. 8C), a method is provided for removing reagent gases that do not contribute to growth of epitaxial layers during hydride vapor-phase epitaxial growth. Thus, FIG. 8C schematically represents a series of steps involved in a method for removing reagent gases from a reactor of a vapor-phase epitaxy system, according to the invention. Step 100 involves providing a reactor having an inlet and an outlet. Step 102 involves arranging a susceptor in the reactor. Such a susceptor includes a stage and at least one channel or channel unit. The at least one channel of the susceptor is located beneath the stage and promotes the downstream passage of reagent gases. The at least one channel may be partially enclosed (e.g., FIG. 3B) or completely enclosed (e.g., FIG. 3C), within the susceptors. Step 104 involves introducing a stream of reagent gases into the reactor via an inlet.

Step 106 involves allowing the removal of gases from the reactor. Reagent gases that impinge on the susceptor below the substrate must be removed from the system, otherwise they will recirculate within the reactor, leading to indiscriminate deposition on system components. According to the instant invention, superfluous reagent gas, which did not contribute to growth of an epitaxial layer, flows through the at least one channel and thence may be flushed from the reactor. In this way, an epitaxial layer free from unwanted deposition may be grown.

According to the invention, almost all of the reaction product of the source gases is used in epitaxial growth on substrate 14, thereby minimizing premature deposition on susceptor 32, and greatly improving the efficiency of the epitaxial growth process. Furthermore, truncated susceptor 32 of the invention leads to improved morphology of the epitaxial layer, since there is no possibility of the epitaxial layer merging or fusing with low-quality deposits on susceptor 32. Also, the truncated susceptor 32 of the invention reduces the potential of particles adhering to the substrate caused from unwanted deposition over the substrate.

Finally, using deposition systems 10, 10a–c of the invention, the flow of reagents is not impeded by unwanted deposits on the upstream section of susceptor 32. Since the design of susceptor 32 prevents premature deposition altogether, it is preferable to prior art systems and methods which require manual cleaning and/or etching of reactor 21 components. Because systems and methods of the invention avoid interruption of epitaxial growth, thick epitaxial layers can be grown in a single run, and use of reactor 21 can be continuous.

For purposes of illustration, the invention has been described primarily in relation to a particular HVPE reactor. However, apparatus and methods of the invention may find applications in any vapor-phase deposition process where premature deposition of a substance on a susceptor may present a problem. Thus, the invention could be incorporated into any HVPE system, for deposition of practically any material. Furthermore, it is suitable for use in other systems where epitaxial layers are grown by reaction of gas-phase sources including organo-metallic reagents used in MOCVD techniques.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A method of vapor-phase deposition of a material on a substrate, comprising the steps of:
   a) providing the substrate, wherein the substrate includes a substrate upper edge and a substrate lower edge;
   b) positioning the substrate on a stage of a susceptor, the susceptor including a basal side and a truncation side, the truncation side disposed at an angle to the basal side, the susceptor for arrangement within a reactor, the reactor including an inlet for introducing a stream of reagent gases into the reactor, wherein the stage is inclined towards the stream of reagent gases, the stage includes a stage upper edge and a stage lower edge, the stage lower edge is located upstream of the stage upper edge with respect to the stream of reagent gases, the truncation side including a truncation side upper edge and a truncation side lower edge, the truncation side upper edge is upstream of the truncation side lower edge with respect to the stream of reagent gases, wherein the stage lower edge and the truncation side upper edge coincide to define a nose end-piece;
   c) arranging the susceptor within the reactor; and
   d) introducing the stream of reagent gases into the reactor.

2. The method of claim 1, wherein said step b) comprises positioning the substrate on the stage such that the substrate lower edge is substantially aligned with the stage lower edge.

3. The method of claim 1, wherein the susceptor includes at least one channel, the at least one channel for promoting passage of reagent gases in a direction downstream of the substrate lower edge.

4. The method of claim 3, wherein the at least one channel is located beneath the stage, and the at least one channel promotes the downstream passage of reagent gases beneath the stage.

5. The method of claim 1, wherein the reactor includes a reactor wall, the reactor wall including a reactor lower wall portion, and the reactor wall having at least one susceptor support unit for supporting the susceptor above the reactor lower wall portion.

6. The method of claim 5, wherein the at least one susceptor support unit elevates the susceptor above the reactor lower wall portion and allows reagent gases to flow downstream beneath the stage.

7. The method of claim 1, wherein the reactor includes a reactor lower wall, the reactor lower wall including at least one reactor channel, the at least one reactor channel for channeling the stream of reagent gases downstream beneath the stage.

8. A vapor-phase deposition system for vapor-phase deposition of a material on a substrate, comprising:
   a) a reactor having a reactor wall;
   b) a susceptor including a basal side, a stage, and a nose portion, said nose portion terminating at a nose end-piece, said stage having a stage lower edge, said stage and said basal side joined at said stage lower edge to define said nose end-piece; and
   c) at least one channel unit for promoting downstream passage of gases beneath said stage.

9. The system of claim 8, wherein said at least one channel unit comprises at least one reactor channel.

10. The system of claim 9, wherein said at least one reactor channel comprises at least one conduit.

11. The system of claim 9, wherein said at least one reactor channel comprises at least one groove in said reactor wall.

12. The system of claim 10, wherein said at least one groove has a depth of from 0.05 to 0.5 ID, and a diameter of from 0.10 ID to 0.5 ID.

13. The system of claim 8, wherein said at least one channel unit comprises at least one susceptor support unit, said at least one susceptor support unit attached to said reactor wall.

14. The system of claim 13, wherein said reactor includes a reactor lower wall, and said at least one susceptor support unit elevates said basal side of said susceptor above said reactor lower wall to a distance of from 0.10 ID to 0.33 ID.

15. The system of claim 8, wherein said at least one channel unit is integral with said susceptor and is located beneath said stage.

16. A susceptor for performing vapor-phase epitaxy, comprising a basal side, a stage, a truncation side and a nose portion, said nose portion terminating in a nose end-piece, said stage having a stage lower edge, and said truncation side having a truncation side upper edge, said stage and said truncation side joined at said stage lower edge and at said truncation side upper edge to define said nose end-piece, said truncation side angled with respect to said basal side such that said nose end-piece is elevated with respect to said basal side.

17. The susceptor of claim 16, further comprising at least one channel for promoting downstream passage of gases beneath said stage.

18. The susceptor of claim 17, wherein said at least one channel is arranged beneath said stage.

19. The susceptor of claim 16, wherein said stage and said truncation side form an angle a of from 10 to 90°.

20. The susceptor of claim 16, wherein said stage and said truncation side form an angle a of from 15 to 45°.

21. The susceptor of claim 16, wherein said nose end-piece is elevated above said basal side to a height h of from 0.10 times to 0.60 times ID.

22. A method of vapor-phase deposition of a material on a substrate, comprising the steps of:
   a) providing the substrate, wherein the substrate includes a substrate upper edge and a substrate lower edge;
   b) positioning the substrate on a stage of a susceptor, the susceptor including a basal side, a stage, and a nose portion, said nose portion terminating in a nose end-piece, said stage having a stage lower edge, said stage lower edge coinciding with said nose end-piece;
   c) providing a reactor having at least one channel unit, the at least one channel unit for promoting downstream passage of gases beneath said nose end-piece;
   d) arranging the susceptor within the reactor; and
   e) introducing a stream of reagent gases into the reactor.

23. The method of claim 22, wherein said step b) comprises positioning the substrate on the stage such that the substrate lower edge is aligned with said nose end-piece.

24. The method of claim 22, wherein the reactor includes a reactor wall and the at least one channel unit includes at least one groove in the reactor wall.

25. The method of claim 22, wherein the at least one channel unit includes at least one susceptor support unit, and the at least one susceptor support unit is in contact with the reactor wall.

26. A vapor-phase deposition system for vapor-phase deposition of a material on a substrate, comprising:
   a) a reactor having a reactor wall; and
   b) a susceptor for placement within said reactor wall, said susceptor including a basal side, a stage, a truncation side and a nose portion, said nose portion terminating at a nose end-piece, said stage having a stage lower edge, and said truncation side having a truncation side upper edge, said stage and said truncation side joined at said stage lower edge and said truncation side upper edge to define said nose end-piece, said truncation side angled with respect to said basal side to form an angle β in the range of from 90 to 170°.

27. The system of claim 26, wherein said nose end-piece is elevated to a height h with respect to said basal side, wherein h is in the range of 0.1 to 0.6 ID.

28. The system of claim 26, wherein said truncation side and said stage form an angle a in the range of from 10 to 90°.

29. The system of claim 26, wherein said susceptor includes at least one channel, said at least one channel adapted for promoting passage of a stream of gas beneath said stage.

30. The system of claim 26, further comprising at least one susceptor support unit for separating said susceptor from said reactor wall.

31. The system of claim 26, wherein said reactor further comprises at least one channel arranged on said reactor wall.

32. A method for avoiding unwanted deposition and reaction of reagent gases which do not contribute to growth of an epitaxial layer in vapor-phase epitaxy systems, comprising the steps of:

a) providing a reactor having an inlet and an outlet;

b) arranging a susceptor within the reactor, the susceptor having a stage and at least one channel, the at least one channel allowing the downstream passage of reagent gases beneath the stage;

c) introducing a stream of reagent gases into the reactor via the inlet; and d) allowing the reagent gases which do not contribute to growth of the epitaxial layer to pass through the at least one channel and thence out of the outlet of the reactor.

* * * * *